(12) United States Patent
Guo et al.

(10) Patent No.: US 12,349,529 B2
(45) Date of Patent: Jul. 1, 2025

(54) DISPLAY PANEL AND DISPLAY DEVICE

(71) Applicant: TCL China Star Optoelectronics Technology Co., Ltd., Guangdong (CN)

(72) Inventors: Jiacong Guo, Guangdong (CN); Ji Li, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/772,172

(22) PCT Filed: Apr. 19, 2022

(86) PCT No.: PCT/CN2022/087658
§ 371 (c)(1),
(2) Date: Apr. 27, 2022

(87) PCT Pub. No.: WO2023/178777
PCT Pub. Date: Sep. 28, 2023

(65) Prior Publication Data
US 2024/0304767 A1    Sep. 12, 2024

(30) Foreign Application Priority Data
Mar. 24, 2022   (CN) .................. 202210302727.X

(51) Int. Cl.
*H10H 29/855*   (2025.01)
*H01L 25/075*   (2006.01)
(Continued)

(52) U.S. Cl.
CPC ....... *H10H 29/855* (2025.01); *H01L 25/0753* (2013.01); *H10H 20/855* (2025.01);
(Continued)

(58) Field of Classification Search
CPC ..... H01L 33/58; H01L 25/0753; H01L 27/15; H10H 29/855; H10H 20/855; H10H 29/14;
(Continued)

(56) References Cited

U.S. PATENT DOCUMENTS 9,406,724 B2    8/2016   Choi et al.
10,707,275 B2   7/2020   Kim
(Continued)

FOREIGN PATENT DOCUMENTS

CN    107579095    1/2018
CN    110196502    9/2019
(Continued)

OTHER PUBLICATIONS

International Search Report and the Written Opinion Dated Jul. 28, 2022 From the International Searching Authority Re. Application No. PCT/CN2022/087658 and Its Translation Into English. (18 Pages).

*Primary Examiner* — Ratisha Mehta
*Assistant Examiner* — Brad A Knudson

(57) ABSTRACT

The present application provides a display panel and a display device. In the present application, a prism is arranged in the light-exiting direction of the light-emitting chip, and the prism includes protrusions, so that the prism can concentrate the light emitted by the light-emitting chips, thereby reducing a width of the light mixing area between adjacent light-emitting chips, and reducing a width of the black matrix, thus reducing the color shift, improving an aperture ratio, and reducing a distance between adjacent light-emitting chips to improve the resolution.

16 Claims, 4 Drawing Sheets

(51) Int. Cl.
*H10H 20/855* (2025.01)
*H10H 29/14* (2025.01)
*H10H 20/852* (2025.01)

(52) U.S. Cl.
CPC ........... *H10H 29/14* (2025.01); *H10H 20/852* (2025.01); *H10H 29/8552* (2025.01)

(58) Field of Classification Search
CPC . H10H 29/8552; G02B 6/0036; G02B 6/0053
See application file for complete search history.

(56) References Cited

U.S. PATENT DOCUMENTS

| | | | |
|---|---|---|---|
| 2014/0339509 A1 | 11/2014 | Choi | |
| 2015/0084026 A1 | 3/2015 | Miyamoto et al. | |
| 2018/0114949 A1* | 4/2018 | Ishikawa | H10K 50/858 |
| 2022/0238769 A1* | 7/2022 | Ling | H01L 27/156 |
| 2023/0086115 A1* | 3/2023 | Takagi | G02B 1/14 |
| | | | 257/40 |
| 2023/0187579 A1* | 6/2023 | Jeong | H01L 33/24 |
| | | | 257/79 |
| 2023/0361097 A1* | 11/2023 | Oyama | G09F 9/33 |

FOREIGN PATENT DOCUMENTS

| | | |
|---|---|---|
| CN | 113036052 | 6/2021 |
| WO | WO 2021/176882 | 9/2021 |

\* cited by examiner

DISPLAY PANEL AND DISPLAY DEVICE

RELATED APPLICATIONS

This application is a National Phase of PCT Patent Application No. PCT/CN2022/087658 having International filing date of Apr. 19, 2022, which claims the benefit of priority of Chinese Patent Application No. 202210302727.X filed on Mar. 24, 2022. The contents of the above applications are all incorporated by reference as if fully set forth herein in their entirety.

FIELD AND BACKGROUND OF THE INVENTION

The present application relates to the field of display technology, and in particular, to a display panel and a display device.

With development of display technology, in order to realize thinning of display device, sub-millimeter light-emitting diode (mini-LED) direct display technology has emerged. This technology refers to directly setting mini-LEDs in the display panel as pixel points and lighting the mini-LEDs to realize display. Since this technology does not require structures such as backlight and liquid crystal, a thickness of the display device is greatly reduced. In detail, a current mini-LED direct display technology refers to arranging red LEDs, green LEDs, and blue LEDs. However, during a display process, light emitted by LEDs of different colors will be mixed on a light-exiting surface of the display panel, which causes the display panel to appear color shift, resulting in reduction in resolution of the display panel. In order to solve this problem, in the prior art, the mixed light is shielded by disposing black matrix (BM) in an area between LEDs of different colors, but this will lead to partial light loss, increase energy consumption, and result in a lower aperture ratio of the display device.

Therefore, the existing mini-LED display device has the technical problem of low aperture ratio caused by a need to dispose the BM between adjacent light-emitting units for shielding.

SUMMARY OF THE INVENTION

Embodiments of the present application provide a display panel and a display device, which are used to alleviate the technical problem of low aperture ratio caused by the need to dispose BM between adjacent light-emitting units for shielding in the existing mini-LED display device.

In order to solve the above-mentioned problems, the technical solutions provided by this application are as follows:

A display panel including:
a substrate;
a driving circuit layer disposed on a side of the substrate;
a plurality of light-emitting chips disposed in an array on a side of the driving circuit layer away from the substrate, wherein the light-emitting chips are electrically connected to the driving circuit layer; and
an encapsulation layer disposed on a side of the light-emitting chips away from the driving circuit layer,
wherein the display panel further includes one or more prisms, the prism is arranged in a direction of the encapsulation layer away from the light-emitting chips, the prism includes protrusions arranged in an array, and at least one of the light-emitting chips is arranged corresponding to the prism.

In some embodiments, the light-emitting chips include red light-emitting chips, green light-emitting chips, and blue light-emitting chips, and the prism is disposed on the red light-emitting chips, the green light-emitting chips, and the blue light-emitting chips, or each of the prisms is respectively disposed corresponding to one of the red light-emitting chips, the green light-emitting chips, and the blue light-emitting chips.

In some embodiments, when the prism is disposed on the red light-emitting chips, the green light-emitting chips, and the blue light-emitting chips, the prism includes first microprisms, and each of the first microprisms is respectively disposed corresponding to one of the red light-emitting chips, the green light-emitting chips, and the blue light-emitting chips.

In some embodiments, when each of the prisms is disposed corresponding to one of the red light-emitting chips, the green light-emitting chips, and the blue light-emitting chips respectively, each prism includes a plurality of second microprisms arranged in an array, and projections of adjacent ones of the second microprisms on the encapsulation layer are in contact with each other.

In some embodiments, the second microprisms include quadrangular pyramids, the second microprisms are arranged along lateral and longitudinal directions of the light-emitting chips, the second microprisms in each column are aligned, and the second microprisms in each row are aligned.

In some embodiments, a height of the second microprisms is one-half to two-thirds of a height of the prism.

In some embodiments, the second microprism includes first sub-microprisms located in a middle area and second sub-microprisms located in an edge area, projections of the second sub-microprisms on the encapsulation layer are in contact, and a distance between the first sub-microprisms is greater than a distance between the second sub-microprisms.

In some embodiments, a width of a cross section of the prism is greater than or equal to a width of a cross section of the light-emitting chip.

In some embodiments, the display panel further includes a black matrix, the black matrix is disposed in a direction of the prism away from the encapsulation layer, and a width of the black matrix is greater than or equal to a width of a light mixing area of adjacent ones of the light-emitting chips.

Meanwhile, an embodiment of the present application provides a display device, the display device includes a display panel and a driving chip, and the display panel includes:
a substrate;
a driving circuit layer disposed on a side of the substrate;
a plurality of light-emitting chips disposed in an array on a side of the driving circuit layer away from the substrate, wherein the light-emitting chips are electrically connected to the driving circuit layer; and
an encapsulation layer disposed on a side of the light-emitting chips away from the driving circuit layer,
wherein the display panel further includes one or more prisms, the prism is arranged in a direction of the encapsulation layer away from the light-emitting chips, the prism includes protrusions arranged in an array, and at least one of the light-emitting chips is arranged corresponding to the prism.

In some embodiments, the light-emitting chips include red light-emitting chips, green light-emitting chips, and blue light-emitting chips, and the prism is disposed on the red light-emitting chips, the green light-emitting chips, and the blue light-emitting chips, or each of the prisms is respectively disposed corresponding to one of the red light-emitting chips, the green light-emitting chips, and the blue light-emitting chips.

In some embodiments, when the prism is disposed on the red light-emitting chips, the green light-emitting chips, and the blue light-emitting chips, the prism includes first microprisms, and each of the first microprisms is respectively disposed corresponding to one of the red light-emitting chips, the green light-emitting chips, and the blue light-emitting chips.

In some embodiments, when each of the prisms is disposed corresponding to one of the red light-emitting chips, the green light-emitting chips, and the blue light-emitting chips, respectively, each prism includes a plurality of second microprisms arranged in an array, and projections of adjacent ones of the second microprisms on the encapsulation layer are in contact with each other.

In some embodiments, the second microprisms include quadrangular pyramids, the second microprisms are arranged along lateral and longitudinal directions of the light-emitting chips, the second microprisms in each column are aligned, and the second microprisms in each row are aligned.

In some embodiments, a height of the second microprisms is one-half to two-thirds of a height of the prism.

In some embodiments, the second microprism includes first sub-microprisms located in a middle area and second sub-microprisms located in an edge area, projections of the second sub-microprisms on the encapsulation layer are in contact, and a distance between the first sub-microprisms is greater than a distance between the second sub-microprisms.

In some embodiments, a width of a cross section of the prism is greater than or equal to a width of a cross section of the light-emitting chip.

In some embodiments, the display panel further includes a black matrix, the black matrix is disposed in a direction of the prism away from the encapsulation layer, and a width of the black matrix is greater than or equal to a width of a light mixing area of adjacent ones of the light-emitting chips.

In some embodiments, the prism is disposed on the encapsulation layer.

In some embodiments, a refractive index of the prism is greater than a refractive index of the encapsulation layer.

The present application provides a display panel and a display device; the display panel includes a substrate; a driving circuit layer disposed on a side of the substrate; a plurality of light-emitting chips disposed in an array on a side of the driving circuit layer away from the substrate, wherein the light-emitting chips are electrically connected to the driving circuit layer; and an encapsulation layer disposed on a side of the light-emitting chips away from the driving circuit layer, wherein the display panel further includes one or more prisms, the prism is arranged in a direction of the encapsulation layer away from the light-emitting chips, the prism includes protrusions arranged in an array, and at least one of the light-emitting chips is arranged corresponding to the prism. In the present application, a prism is arranged in the light-exiting direction of the light-emitting chip, and the prism includes protrusions, so that the prism can concentrate the light emitted by the light-emitting chips, thereby reducing the angle of the light emitted by the light-emitting chips, reducing the light radiating to adjacent light-emitting chips, reducing a width of the light mixing area between adjacent light-emitting chips, and reducing a width of the black matrix, thus reducing the color shift, improving an aperture ratio, and reducing a distance between adjacent light-emitting chips to improve the resolution.

DESCRIPTION OF SPECIFIC EMBODIMENTS OF THE INVENTION

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

Figure 1:
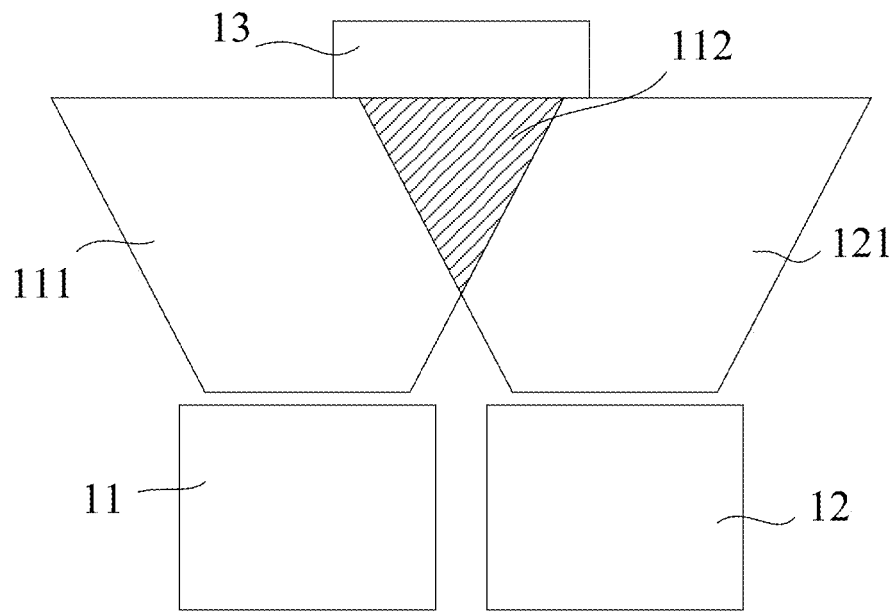
FIG. 1 is a schematic diagram of a conventional mini-LED display device.

As shown in FIG. 1, in the existing mini-LED display device, a plurality of LEDs are arranged to serve as pixels, and directly realizes the display through light emission of the LEDs. However, during the display process, as shown in FIG. 1, taking the red LED11 and the green LED12 as an example, the red light area 111 where the light is emitted by the red LED11 and the green light area 121 where the light is emitted by the green LED12 have an intersection area 112. Since the light in the intersection area 112 is the mixed light of red light and green light, the display panel will suffer from problems such as contrast reduction and color shift during display. Therefore, in the current display device, the black matrix 13 may be disposed in the light mixing area to block the mixed light to avoid color shift, but this will lead to partial light loss and increase power consumption of the display device. In addition, due to a large width of the black matrix, an aperture ratio of the display device will be low. Therefore, the existing mini-LED display device has the technical problem of low aperture ratio caused by the need to dispose BM between adjacent light-emitting units for shielding.

In view of the above technical problems, embodiments of the present application provide a display panel and a display device to alleviate the above technical problems.

Figure 2:
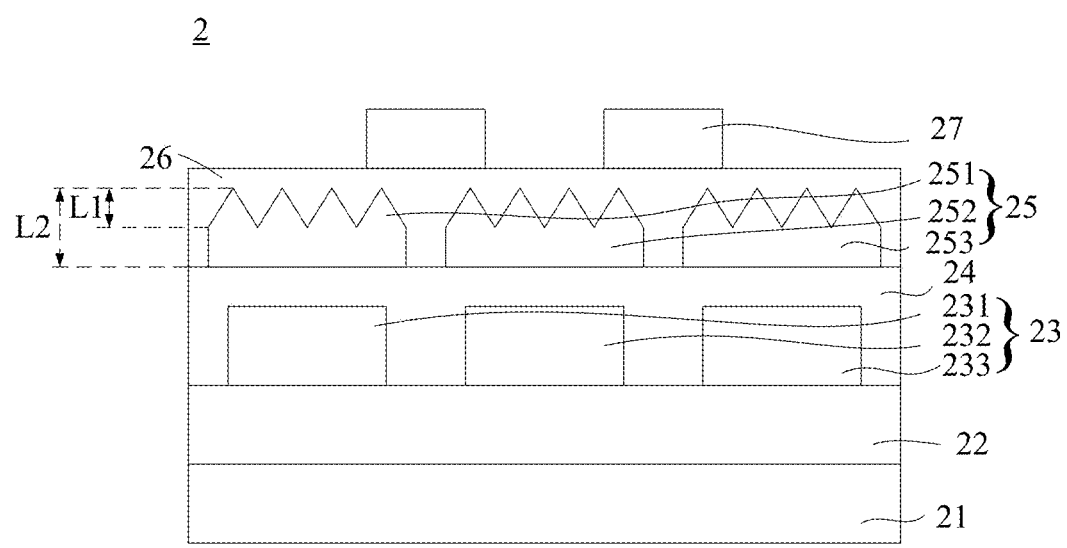
FIG. 2 is a first schematic diagram of a display panel provided by an embodiment of the present application.

As shown in FIG. 2, an embodiment of the present application provides a display panel, and the display panel 2 includes:
- a substrate 21;
- a driving circuit layer 22 disposed on a side of the substrate 21;
- a plurality of light-emitting chips 23 disposed in an array on a side of the driving circuit layer 22 away from the substrate 21, wherein the light-emitting chips 23 are electrically connected to the driving circuit layer 22; and an encapsulation layer 24 disposed on a side of the light-emitting chips 23 away from the driving circuit layer 22, wherein the display panel 2 further includes one or more prisms 25, the prism 25 is arranged in a direction of the encapsulation layer 24 away from the light-emitting chips 23, the prism 25 includes protrusions arranged in an array, and at least one of the light-emitting chips 23 is arranged corresponding to the prism 25.

An embodiment of the present application provides a display panel. In the display panel, a prism is arranged in a light-exiting direction of the light-emitting chip, and the prism includes a protrusion, so that the prism can concentrate the light emitted by the light-emitting chips, thereby reducing the angle of the light emitted by the light-emitting chips, reducing the light radiating to adjacent light-emitting chips, reducing a width of the light mixing area between adjacent light-emitting chips, and reducing a width of the black matrix, thus reducing the color shift, improving an aperture ratio, and reducing a distance between adjacent light-emitting chips to improve the resolution.

Figure 3:
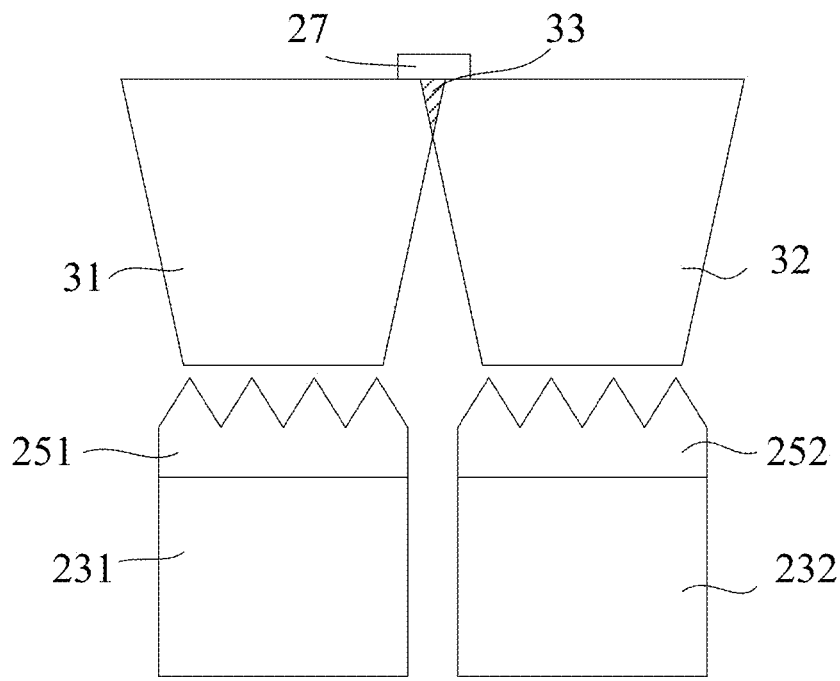
FIG. 3 is a second schematic diagram of a display panel according to an embodiment of the present application.

In detail, as shown in FIG. 3, taking the display panel in the embodiment of the present application as an example, the light-emitting chips include a red light-emitting chip 231 and a green light-emitting chip 232, and the red light-emitting chip 231 is provided with a first prism 251, and the green light-emitting chip 232 is provided with a second prism 252 (other layers are omitted in FIG. 3). When the red light-emitting chip 231 and the green light-emitting chip 232 emit light, as shown in FIG. 3, due to the existence of the prism, the light emitted by the red light-emitting chip 231 and the green light-emitting chip 232 will converge respectively, causing the areas corresponding to the red light emitted by the red light-emitting chip 231 and the green light emitted by the green light-emitting chip 232 to shrink. As shown in FIG. 1 and FIG. 3, compared with the areas corresponding to the red light and the green light in FIG. 1, the red light area 31 and the green light area 32 in FIG. 3 are both smaller, and divergence angles of the red light and the green light become smaller, so that the mixed area 33 of the red light area 31 and the green light area 32 becomes smaller, and the width of the corresponding black matrix 27 can be set smaller, so that the aperture ratio of the display panel is increased, the color shift is improved, and the aperture ratio of the display panel in the present application is improved compared with the current display device, the loss of light is reduced, and the power consumption of the display panel can be reduced. Under the pixel units of the same area, while increasing the aperture ratio, the distance between the pixel units can be reduced to increase the number of pixels, thereby increasing the aperture ratio of the display panel.

It should be noted that the light of each color of the display panel is formed by mixing red light, green light, and blue light. Therefore, the light emitted by the light-emitting chips will finally be mixed to obtain the required light. The mixed light in the embodiments of the present application refers to that the light emitted by the light-emitting chip is mixed in the non-mixed area, resulting in disorder in the subsequent mixed light and color shift of the display panel. Therefore, the problem of the light mixing described in the following embodiments refers to such a problem, rather than the normal light mixing of the display panel, which will not be repeated in the following embodiments for brevity.

In one embodiment, the prism is disposed on the encapsulation layer. By arranging the prism on the encapsulation layer, the distance between the prism and the light-emitting chip is closer, so that the prism can better converge the light emitted by the light-emitting chip, and correspondingly, the angle of the light emitted by the light-emitting chip can be made smaller, thereby further increasing the aperture ratio of the display panel.

In an embodiment, as shown in FIG. 2, the light-emitting chip 23 includes a red light-emitting chip 231, a green light-emitting chip 232, and a blue light-emitting chip 233, and the prism is disposed on the red light-emitting chip, the green light-emitting chip and the blue light-emitting chip. Alternatively, each of the prisms 25 are respectively disposed corresponding to the red light-emitting chip 231, the green light-emitting chip 232, and the blue light-emitting chip 233.

In detail, when the prism is disposed on the red light-emitting chip, the green light-emitting chip and the blue light-emitting chip, the prism includes first microprisms, and each of the first microprisms is arranged corresponding to the red light-emitting chip, the green light-emitting chip, and the blue light-emitting chip. When arranging the prism, the whole layer of the prism can be arranged on the encapsulation layer to simplify the process in the preparation of the prism, and the prism can further protect the light-emitting chip. By arranging each of the first microprisms corresponding to the red light-emitting chip, the green light-emitting chip, and the blue light-emitting chip, the first microprisms can converge light, reduce the angle of the light emitted by each of the light-emitting chips, and make the light mixing area of the light emitted from the corresponding light-emitting chip smaller or even no light mixing occurs, thereby improving the aperture ratio of the display panel.

In detail, for example, the prism includes a plurality of first microprisms, and each of the first microprisms can converge light. By arranging the prism on the encapsulation layer, each of the first microprisms in the prism is arranged corresponding to each of the light-emitting chips. Each of the first microprisms converges the light of each of the light-emitting chips respectively, and reduces the angle of the light emitted by each of the light-emitting chips, thereby reducing the light mixing area of the light emitted by the adjacent light-emitting chips, and even making the light emitted by the adjacent light-emitting chips free form light mixing, thus improving the aperture ratio of the display panel.

In detail, it is directed to the technical problem that the prisms arranged on the plurality of light-emitting chips have poor light converging effect. By correspondingly disposing the prism on each of the light-emitting chips, each prism can converge the light emitted by the light-emitting chip, and because each of the light-emitting chips corresponds to at least one prism, the prisms can better converge the light of the light-emitting chip, thereby reducing the light mixing area of the light emitted by the adjacent light-emitting chips, and even making the light emitted by the adjacent light-emitting chips free form light mixing, thus improving the aperture ratio of the display panel.

In detail, as shown in FIG. 2, the prism 25 includes a first prism 251, a second prism 252, and a third prism 253. The first prism 251 is disposed corresponding to the red light-emitting chip 231, the second prism 252 is disposed corresponding to the green light-emitting chip 232, and the third prism 253 is disposed corresponding to the blue light-emitting chip 233. The first prism, the second prism, and the third prism are disposed corresponding to the red light-emitting chip, the green light-emitting chip, and the blue light-emitting chip, respectively, so that each prism can be configured to converge the light of each of the light-emitting chips, thereby reducing the light mixing area of the light emitted by the adjacent light-emitting chips, and even making the light emitted by the adjacent light-emitting chips free form light mixing, thus improving the aperture ratio of the display panel.

In an embodiment, as shown in FIG. 2, when each of the prisms 25 is disposed corresponding to the red light-emitting chip 231, the green light-emitting chip 232, and the blue light-emitting chip 233 respectively, the prism includes a plurality of second microprisms arranged in an array, and projections of adjacent ones of the second microprisms on the encapsulation layer are in contact with each other. By making the prism include a plurality of second microprisms, the light emitted by the light-emitting chip is converged by the plurality of second microprisms, so that the emission angle of the light is small, and the projections of the adjacent second microprisms on the encapsulation layer are in contact with each other, so that when the light passes through the prism, the light will pass through the second microprisms, preventing the light from passing through the gap between the second microprisms, so that the prism can converge the light and reduce the angle of light divergence, thereby reducing the light mixing area of the light emitted by the adjacent light-emitting chips, and even making the light emitted by the adjacent light-emitting chips free form light mixing, thus improving the aperture ratio of the display panel.

Figure 4:
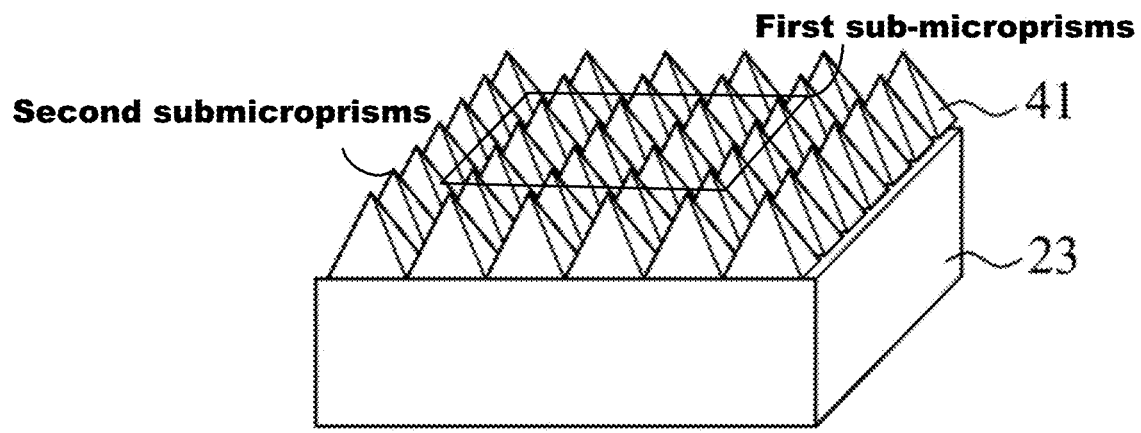
FIG. 4 is a third schematic diagram of a display panel provided by an embodiment of the present application.

In an embodiment, as shown in FIG. 4, the second microprisms include quadrangular pyramids, the second microprisms 41 are arranged along the lateral and longitudinal directions of the light-emitting chips 23, wherein each column of the second microprisms 41 are aligned, and each row of the second microprisms 41 are aligned. By making the prisms include a plurality of quadrangular pyramids, the quadrangular pyramids can converge light, so that when the light-emitting chips emits light, the light can be refracted and reflected by the plurality of quadrangular pyramids, so that the light can be converged after passing through the prism structure, thereby reducing the angle of light divergence. Meanwhile, the second microprisms are arranged in the horizontal and vertical directions, and the second microprisms in each column are aligned and the second microprisms in each row are aligned, so that the light emitted by the light-emitting chips in four directions can be converged by the second microprisms, and thus the angles of the light emitted in four directions are reduced, so that the angles of the light in all directions emitted by the light-emitting chip can be reduced, thereby reducing the light mixing area of the light emitted by the adjacent light-emitting chips, and even making the light emitted by the adjacent light-emitting chips free form light mixing, thus improving the aperture ratio of the display panel.

In detail, as shown in FIG. 3, it can be seen that the prism includes a plurality of second microprisms in the shape of quadrangular pyramids, and the second microprisms form a pyramid-shaped prism. By arranging the prism on each of the light-emitting chips, the light will be converged by the prism when passing through the prism, which reduces the angle of the light, thereby reducing the light mixing area of the light emitted by the adjacent light-emitting chips, and even making the light emitted by the adjacent light-emitting chips free from mixed light, thus improving the aperture ratio of the display panel.

In detail, as shown in FIG. 3, it can be seen that a horizontal direction (lateral direction) of the bottom surface of the quadrangular pyramid is the same as a horizontal direction of the light-emitting chip, and a longitudinal direction (not the vertical direction here) of the bottom surface of the quadrangular pyramid is the same as a longitudinal direction of the light-emitting chip, that is, an arrangement direction of the second microprism is the same as an arrangement direction of the light-emitting chip. In addition, each column of the second microprisms is aligned, and each row of the second microprisms is aligned, so that the light emitted by the light-emitting chips to the surrounding area will pass through the prisms, and the prisms can converge the light and reduce the light emitted by the light-emitting chips to the surrounding area, thereby reducing the light mixing area of the light emitted by the adjacent light-emitting chips, and even making the light emitted by the adjacent light-emitting chips free form light mixing, thus improving the aperture ratio of the display panel.

It should be noted that, in the above embodiments, the second microprism having a shape of a quadrangular pyramid is taken as an example for detailed description, but the embodiments of the present application are not particularly limited thereto. For example, the side surface of the second microprism can be a curved surface, and the top surface of the second microprism can be a flat surface. For example, the side surface of the second microprism can be an uneven surface, and the shape of the second microprism is configured by a criterion to converge the light of the light-emitting chip.

In an embodiment, as shown in FIG. 2, a height L1 of the second microprism is one-half to two-thirds of a height of the prism 25. By making the height of the second microprism to be one-half to two-thirds of the height of the prism, all the light emitted by the light-emitting chips can pass through the prisms, and after the light enters the prisms, the second microprisms on the prisms has a better shrinkage effect on the angle of the light, thereby reducing the angle of the light. In addition, by making the adjacent second microprisms in contact with each other, the direct emission of light from the gaps in the second microprisms is prevented, resulting in a larger light mixing area between adjacent light-emitting chips, thereby reducing the light mixing area of the light emitted by adjacent light-emitting chips, even making the light emitted by the adjacent light-emitting chips free from light mixing, thus improving the aperture ratio of the display panel.

In an embodiment, the second microprisms are uniformly arranged, and when the second microprisms are arranged, the second microprisms can be uniformly arranged, so that the second microprisms can adjust the angle of the light in each area and in each direction by the same magnitude, so that while reducing the angle of the light, the density of the light is more uniform.

The light in the light mixing area between adjacent light-emitting chips is generally light at the edge of the light-emitting chip. In one embodiment, the second microprism includes a first sub-microprism located in a middle area and a second sub-microprism located in an edge area, and projections of the second sub-microprisms located in the edge area on the encapsulation layer are in contact with each other, and a distance between the first sub-microprisms is greater than a distance between the second sub-microprisms. When arranging the first sub-microprism and the second sub-microprism, for the second sub-microprisms located in the edge area, the distance between the second sub-microprisms can be made smaller. For example, the adjacent second sub-microprisms are in direct contact with each other, in order to converge the light at the edge, while for the second sub-microprism located in the middle area, since the light in the middle area is generally not mixed with the light emitted by the adjacent light-emitting chips after emission, the distance between the second sub-microprisms in the middle area can be made larger without changing the angle of the light, so that the light is normally diverged outward.

In detail, during the arranging process of the first sub-microprisms and the second sub-microprisms, the second sub-microprisms can be arranged in an array and the adjacent second sub-microprisms are in contact with each other, so that the second microprisms in the edge area can converge the light emitted to the edge area to reduce a size of the light mixing area of the light emitted by the adjacent light-emitting chips. In detail, the arrangement of the second sub-microprisms may be the arrangement of the second microprisms as shown in FIG. 4, and for the first sub-microprisms, one or a circle the first sub-microprisms may be arranged in the area in contact with the second sub-microprism, or multiple or multiple circles of the first sub-microprisms may be arranged in the area in contact with the second sub-microprisms. In the area that is not in contact with the second sub-micro-prisms, a small amount of the first sub-micro-prisms can be arranged or even no first sub-micro-prisms can be arranged, so that the light can be emitted directly. The second sub-microprism reduces the angle of the light emitted by the light-emitting chip, thereby reducing the light mixing area of the light emitted by the adjacent light-emitting chips, and even making the light emitted by the adjacent light-emitting chips free form light mixing, thus improving the aperture ratio of the display panel.

In one embodiment, a width of a cross section of the prism is greater than or equal to a width of a cross section of the light-emitting chip. By making the width of the cross-section of the prism greater than or equal to the width of the cross-section of the light-emitting chip, the light emitted by the light-emitting chip can pass through the prism instead of being diverged from both sides of the prism, thereby reducing the angle of the light emitted by the light-emitting chip, reducing the light mixing area of the light emitted by the adjacent light-emitting chips, and even making the light emitted by the adjacent light-emitting chips free from light mixing, thus improving the aperture ratio of the display panel.

In one embodiment, a refractive index of the prism is greater than a refractive index of the encapsulation layer. By making the refractive index of the prism greater than the refractive index of the encapsulation layer, the light will be converged after passing through the encapsulation layer and the prism, thereby reducing the angle of the light emitted by the adjacent light-emitting chips, reducing the light mixing area of the light emitted by the adjacent light-emitting chips, and even making the light emitted by the adjacent light-emitting chips free from light mixing, thus improving the aperture ratio of the display panel.

After arranging the prism, there is still a problem that some light will be mixed, resulting in the color shift of the display panel. In an embodiment, as shown in FIG. 2, the display panel further includes a black matrix 27, the black matrix 27 is disposed in a direction of the prism structure 25 away from the encapsulation layer 24, and a width of the black matrix 27 is greater than or equal to a width of the light mixing area of the adjacent light-emitting chips 23. By arranging the black matrix, when the light emitted by the light-emitting chips still produces the light mixing area, the mixed light is blocked by the black matrix, so as to avoid the problem of color shift caused by the light mixing when the display panel is displayed.

In detail, in the above embodiments, the light emitted by the light-emitting chips still subjected to light mixing after passing through the prism is taken as an example, but the embodiment of the present application is not particularly limited thereto. For example, if the light emitted by the light-emitting chips will not be mixed after passing through the prism, the black matrix may not be arranged.

In an embodiment, as shown in FIG. 2, the display panel further includes a planarization layer 26, and the planarization layer 26 is disposed between the black matrix and the prism 25. By disposing the planarization layer, the black matrix is prevented from being directly arranged on the prism to damage the prism, and unevenness of the subsequent layer can be prevented from impacting the display.

In detail, as shown in FIG. 1 and FIG. 3, on the premise that the distance between the light-emitting chips remains unchanged, the present application reduces the light-mixing area of the light-emitting chips by arranging prisms. Therefore, when arranging the light-emitting chips, the distance between the light-emitting chips can be reduced, so that the number of light-emitting chips that can be arranged on the display panel is increased, that is, the number of pixels of the display panel is increased, and the resolution of the display panel is improved. It should be noted that the arrangement of light-emitting chips in the above embodiments does not limit the structure of the display panel. For example, a display panel with flip-chip light-emitting chips can also adopt the prism structure design described in the embodiments of the present application.

Figure 5:
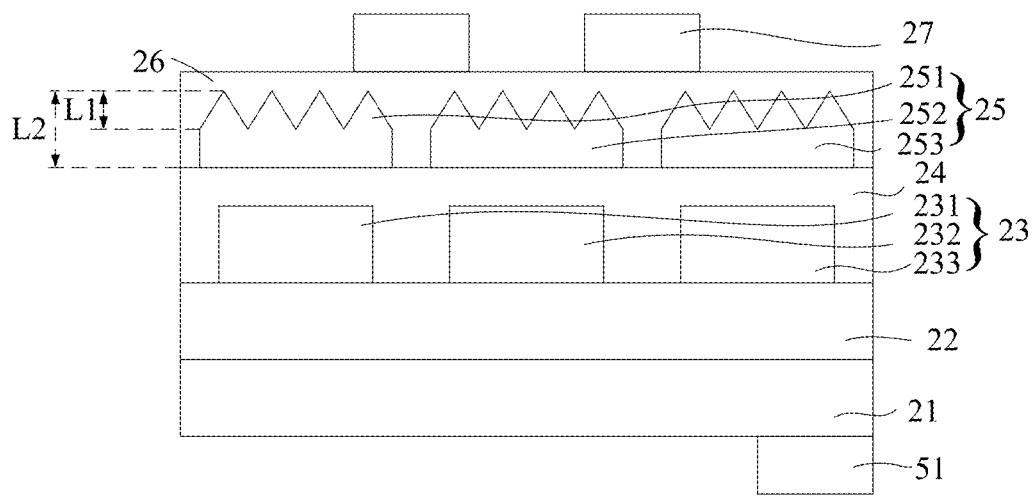
FIG. 5 is a schematic diagram of a display device provided by an embodiment of the present application.
Figure 6:
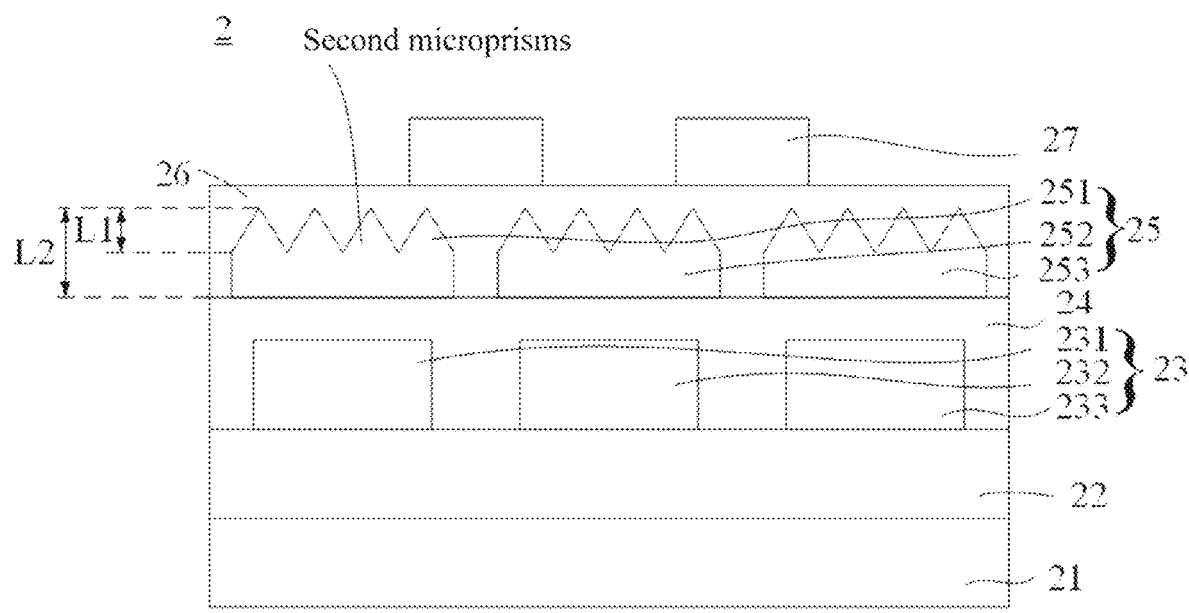
FIG. 6 is a fourth schematic diagram of a display panel provided by an embodiment of the present application.
Figure 7:
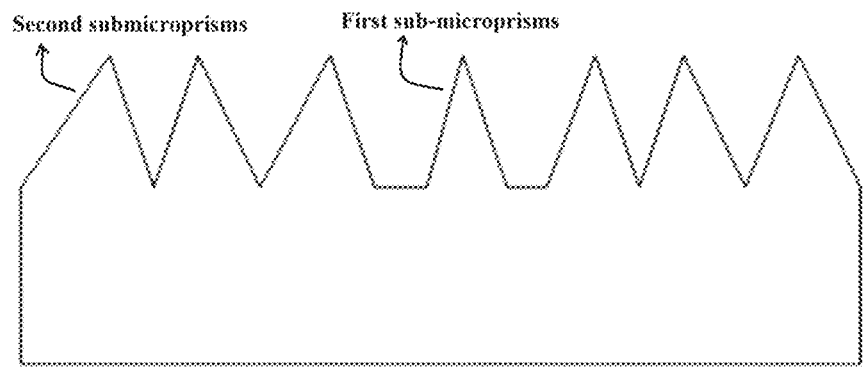
FIG. 7 is a fifth schematic diagram of a display panel provided by an embodiment of the present application.

Meanwhile, as shown in FIG. 5, an embodiment of the present application provides a display device, the display device includes a display panel and a driving chip 51, and the display panel includes:

a substrate 21;

a driving circuit layer 22 disposed on a side of the substrate 21;

a plurality of light-emitting chips 23 disposed in an array on a side of the driving circuit layer 22 away from the substrate 21, wherein the light-emitting chips 23 are electrically connected to the driving circuit layer 22; and an encapsulation layer 24 disposed on a side of the light-emitting chips 23 away from the driving circuit layer 22, wherein the display panel 2 further includes one or more prisms 25, the prism 25 is arranged in a direction of the encapsulation layer 24 away from the light-emitting chips 23, the prism 25 includes protrusions arranged in an array, and at least one of the light-emitting chips 23 is arranged corresponding to the prism 25.

An embodiment of the present application provides a display device, the display device includes a display panel and a driving chip, the display panel is provided with a prism in the light-exiting direction of the light-emitting chips, and the prism includes protrusions, so that the prism can concentrate the light emitted by the light-emitting chips, thereby reducing the angle of the light emitted by the light-emitting chips, reducing the light radiating to adjacent light-emitting chips, reducing a width of the light mixing area between adjacent light-emitting chips, and reducing a width of the black matrix, thus reducing the color shift, improving an aperture ratio, and reducing a distance between adjacent ones of the light-emitting chips to improve the resolution.

In some embodiments, the light-emitting chips include red light-emitting chips, green light-emitting chips, and blue light-emitting chips, and the prism is disposed on the red light-emitting chips, the green light-emitting chips, and the blue light-emitting chips, or each of the prisms is respectively disposed corresponding to one of the red light-emitting chips, the green light-emitting chips, and the blue light-emitting chips.

In an embodiment, in the display device, when the prism is disposed on the red light-emitting chip, the green light-emitting chip and the blue light-emitting chip, the prism includes first microprisms, and each of the first microprisms is arranged corresponding to the red light-emitting chip, the green light-emitting chip, and the blue light-emitting chip.

In some embodiments, when each of the prisms is disposed corresponding to one of the red light-emitting chips, the green light-emitting chips, and the blue light-emitting chips, respectively, each prism includes a plurality of second microprisms arranged in an array, and projections of adjacent ones of the second microprisms on the encapsulation layer are in contact with each other.

In some embodiments, the second microprisms include quadrangular pyramids, the second microprisms are arranged along lateral and longitudinal directions of the light-emitting chips, the second microprisms in each column are aligned, and the second microprisms in each row are aligned.

In one embodiment, in the display device, the height of the second microprism is one-half to two-thirds of the height of the prism.

In one embodiment, the second microprism includes a first sub-microprism located in a middle area and a second sub-microprism located in an edge area, and projections of the second sub-microprisms located in the edge area on the encapsulation layer are in contact with each other, and a distance between the first sub-microprisms is greater than a distance between the second sub-microprisms.

In some embodiments, a width of a cross section of the prism is greater than or equal to a width of a cross section of the light-emitting chip.

In some embodiments, the display panel further includes a black matrix, the black matrix is disposed in a direction of the prism away from the encapsulation layer, and a width of the black matrix is greater than or equal to a width of a light mixing area of adjacent ones of the light-emitting chips.

In some embodiments, the prism is disposed on the encapsulation layer.

In some embodiments, a refractive index of the prism is greater than a refractive index of the encapsulation layer.

According to the above embodiment, it can be known that:

The present application provides a display panel and a display device; the display panel includes a substrate; a driving circuit layer disposed on a side of the substrate; a plurality of light-emitting chips disposed in an array on a side of the driving circuit layer away from the substrate, wherein the light-emitting chips are electrically connected to the driving circuit layer; and an encapsulation layer disposed on a side of the light-emitting chips away from the driving circuit layer, wherein the display panel further includes one or more prisms, the prism is arranged in a direction of the encapsulation layer away from the light-emitting chips, the prism includes protrusions arranged in an array, and at least one of the light-emitting chips is arranged corresponding to the prism. In the present application, a prism is arranged in the light-exiting direction of the light-emitting chip, and the prism includes protrusions, so that the prism can concentrate the light emitted by the light-emitting chips, thereby reducing the angle of the light emitted by the light-emitting chips, reducing the light radiating to adjacent light-emitting chips, reducing a width of the light mixing area between adjacent light-emitting chips, and reducing a width of the black matrix, thus reducing the color shift, improving an aperture ratio, and reducing a distance between adjacent light-emitting chips to improve the resolution.

In the above embodiments, the descriptions of each embodiment have their own emphasis. The parts that are not described in detail in an embodiment can be referred to the detailed descriptions in other embodiments above, which will not be repeated herein for brevity.

The display panel and the display device provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising:
a substrate;
a driving circuit layer disposed on a side of the substrate;
a plurality of light-emitting chips disposed in an array on a side of the driving circuit layer away from the substrate, wherein the light-emitting chips are electrically connected to the driving circuit layer; and
an encapsulation layer disposed on a side of the light-emitting chips away from the driving circuit layer,
wherein the display panel further comprises a plurality of prisms, the plurality of prisms are arranged in a direction of the encapsulation layer away from the light-emitting chips, each of the plurality of prisms comprises a plurality of second microprisms arranged in an array, each of the plurality of light-emitting chips is arranged corresponding to each of the plurality of prisms, each of the plurality of second microprisms comprises a plurality of first sub-microprisms located in a middle region and a plurality of second sub-microprisms located in an edge region, projections of the plurality of second sub-microprisms on the encapsulation layer are in contact with each other, and a distance between two adjacent ones of the first sub-microprisms is greater than a distance between two adjacent ones of the second sub-microprisms.

2. The display panel according to claim 1, wherein the light-emitting chips comprise red light-emitting chips, green light-emitting chips, and blue light-emitting chips, and the prism is disposed on the red light-emitting chips, the green light-emitting chips, and the blue light-emitting chips, or each of the prisms is respectively disposed corresponding to one of the red light-emitting chips, the green light-emitting chips, and the blue light-emitting chips.

3. The display panel according to claim 2, wherein when one of the prisms is disposed on the red light-emitting chips, the green light-emitting chips, and the blue light-emitting chips, the prism comprises first microprisms, and each of the first microprisms is respectively disposed corresponding to one of the red light-emitting chips, the green light-emitting chips, and the blue light-emitting chips.

4. The display panel according to claim 1, wherein the second microprisms comprise quadrangular pyramids, the second microprisms are arranged along lateral and longitudinal directions of the light-emitting chips, the second microprisms in each column are aligned, and the second microprisms in each row are aligned.

5. The display panel according to claim 1, wherein a height of each of the plurality of second microprisms is one-half to two-thirds of a height of each of the plurality of prisms.

6. The display panel according to claim 1, wherein a width of a cross section of each of the prisms is greater than or equal to a width of a cross section of the each of the plurality of light-emitting chips.

7. The display panel according to claim 1, wherein the display panel further comprises a black matrix, the black matrix is disposed in a direction of the plurality of prisms away from the encapsulation layer, and a width of the black matrix is greater than or equal to a width of a light mixing area of adjacent ones of the light-emitting chips.

8. A display device, comprising a display panel and a driving chip, wherein the display panel comprises:
   a substrate;
   a driving circuit layer disposed on a side of the substrate;
   a plurality of light-emitting chips disposed in an array on a side of the driving circuit layer away from the substrate, wherein the light-emitting chips are electrically connected to the driving circuit layer; and
   an encapsulation layer disposed on a side of the light-emitting chips away from the driving circuit layer,
   wherein the display panel further comprises a plurality of prisms, the plurality of prisms are arranged in a direction of the encapsulation layer away from the light-emitting chips, each of the plurality of prisms comprises a plurality of second microprisms arranged in an array, each of the plurality of light-emitting chips is arranged corresponding to each of the plurality of prisms, each of the plurality of second microprisms comprises a plurality of first sub-microprisms located in a middle region and a plurality of second sub-microprisms located in an edge region, projections of the plurality of second sub-microprisms on the encapsulation layer are in contact with each other, and a distance between two adjacent ones of the first sub-microprisms is greater than a distance between two adjacent ones of the second sub-microprisms.

9. The display device according to claim 8, wherein the light-emitting chips comprise red light-emitting chips, green light-emitting chips, and blue light-emitting chips, and the prism is disposed on the red light-emitting chips, the green light-emitting chips, and the blue light-emitting chips, or each of the prisms is respectively disposed corresponding to one of the red light-emitting chips, the green light-emitting chips, and the blue light-emitting chips.

10. The display device according to claim 8, wherein when one of the prisms is disposed on the red light-emitting chips, the green light-emitting chips, and the blue light-emitting chips, the prism comprises first microprisms, and each of the first microprisms is respectively disposed corresponding to one of the red light-emitting chips, the green light-emitting chips, and the blue light-emitting chips.

11. The display device according to claim 8, wherein the second microprisms comprise quadrangular pyramids, the second microprisms are arranged along lateral and longitudinal directions of the light-emitting chips, the second microprisms in each column are aligned, and the second microprisms in each row are aligned.

12. The display device according to claim 8, wherein a height of each of the plurality of second microprisms is one-half to two-thirds of a height of each of the plurality of prisms.

13. The display device according to claim 8, wherein a width of a cross section of each of the prisms is greater than or equal to a width of a cross section of the each of the plurality of light-emitting chips.

14. The display device according to claim 8, wherein the display panel further comprises a black matrix, the black matrix is disposed in a direction of the plurality of prisms away from the encapsulation layer, and a width of the black matrix is greater than or equal to a width of a light mixing area of adjacent ones of the light-emitting chips.

15. The display device according to claim 8, wherein the plurality of prisms are disposed on the encapsulation layer.

16. The display device according to claim 8, wherein a refractive index of each of the plurality of prisms is greater than a refractive index of the encapsulation layer.

* * * * *